United States Patent
Kim et al.

(10) Patent No.: US 7,560,344 B2
(45) Date of Patent: Jul. 14, 2009

(54) SEMICONDUCTOR DEVICE HAVING A PAIR OF FINS AND METHOD OF MANUFACTURING THE SAME

(75) Inventors: Suk-pil Kim, Yongin-si (KR); Yoon-dong Park, Yongin-si (KR); Jong-jin Lee, Seongnam-si (KR); Won-joo Kim, Hwaseong-si (KR); June-mo Koo, Seoul (KR); Seung-hwan Song, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/976,004

(22) Filed: Oct. 19, 2007

(65) Prior Publication Data

US 2008/0111199 A1 May 15, 2008

(30) Foreign Application Priority Data

Nov. 15, 2006 (KR) .................. 10-2006-0113043
Sep. 18, 2007 (KR) .................. 10-2007-0094900

(51) Int. Cl.
*H01L 21/336* (2006.01)

(52) U.S. Cl. .................. 438/270; 438/411; 438/421; 438/422; 438/619; 257/276; 257/522; 257/410; 257/E21.564; 257/E21.573

(58) Field of Classification Search .................. 438/270
See application file for complete search history.

(56) References Cited

U.S. PATENT DOCUMENTS

| | | | | |
|---|---|---|---|---|
| 5,098,856 A | * | 3/1992 | Beyer et al. | 438/422 |
| 5,336,626 A | * | 8/1994 | Lee | 438/168 |
| 6,518,641 B2 | * | 2/2003 | Mandelman et al. | 257/510 |
| 6,664,582 B2 | | 12/2003 | Fried et al. | |
| 6,768,158 B2 | * | 7/2004 | Lee et al. | 257/315 |
| 6,812,115 B2 | * | 11/2004 | Wieczorek et al. | 438/424 |
| 6,876,042 B1 | | 4/2005 | Yu et al. | |

(Continued)

FOREIGN PATENT DOCUMENTS

EP  1 835 530 A2  9/2007

OTHER PUBLICATIONS

European Search Report corresponding to European Application No. 07120149.5 dated Jan. 22, 2009.

*Primary Examiner*—N Drew Richards
*Assistant Examiner*—Ankush K Singal
(74) *Attorney, Agent, or Firm*—Harness, Dickey & Pierce, P.L.C.

(57) ABSTRACT

Example embodiments relate to a semiconductor device and a method of manufacturing the same. A semiconductor device according to example embodiments may have reduced disturbances during reading operations and a reduced short channel effect. The semiconductor device may include a semiconductor substrate having a body and a pair of fins protruding from the body. Inner spacer insulating layers may be formed on an upper portion of an inner sidewall of the pair of fins so as to reduce the entrance to the region between the pair of fins. A gate electrode may cover a portion of the external sidewalls of the pair of fins and may extend across the inner spacer insulating layers so as to define a void between the pair of fins. Gate insulating layers may be interposed between the gate electrode and the pair of fins.

12 Claims, 7 Drawing Sheets

U.S. PATENT DOCUMENTS

| | | |
|---|---|---|
| 6,960,507 B2 * | 11/2005 | Kim et al. .................... 438/270 |
| 7,009,272 B2 * | 3/2006 | Borger et al. ................ 257/522 |
| 7,015,116 B1 * | 3/2006 | Lo et al. ...................... 438/437 |
| 7,279,377 B2 * | 10/2007 | Rueger et al. ............... 438/222 |
| 7,326,625 B2 * | 2/2008 | Jeong et al. ................. 438/386 |
| 7,338,896 B2 * | 3/2008 | Vanhaelemeersch et al. 438/638 |
| 7,400,024 B2 * | 7/2008 | Kunnen ....................... 257/511 |
| 2003/0042612 A1 * | 3/2003 | Leuschner et al. .......... 257/759 |
| 2003/0098493 A1 * | 5/2003 | Marty et al. ................. 257/510 |
| 2003/0113993 A1 | 6/2003 | Lee et al. |
| 2004/0108559 A1 | 6/2004 | Sugii et al. |
| 2004/0126970 A1 * | 7/2004 | Kim ............................ 438/257 |
| 2004/0147093 A1 * | 7/2004 | Marty et al. ................. 438/442 |
| 2005/0110078 A1 * | 5/2005 | Shino ......................... 257/331 |
| 2005/0118783 A1 | 6/2005 | Oh et al. |
| 2005/0242406 A1 | 11/2005 | Hareland et al. |
| 2005/0253203 A1 | 11/2005 | Liaw |
| 2006/0091453 A1 * | 5/2006 | Matsuda et al. ............. 257/330 |
| 2006/0128049 A1 * | 6/2006 | Jaiprakash et al. ............ 438/53 |

* cited by examiner

SEMICONDUCTOR DEVICE HAVING A PAIR OF FINS AND METHOD OF MANUFACTURING THE SAME

PRIORITY STATEMENT

This application claims priority under 35 U.S.C. § 119 to Korean Patent Application No. 10-2006-0113043, filed on Nov. 15, 2006 and Korean patent application No. 10-2007-0094900 filed on Sep. 18, 2007, in the Korean Intellectual Property Office (KIPO), the entire contents of both of which are incorporated herein by reference.

BACKGROUND

1. Technical Field

Example embodiments relate to a non-volatile memory device including a fin-type channel region and a method of manufacturing the non-volatile memory device.

2. Description of the Related Art

Along with further reductions in size, higher capacity data processing may be required for semiconductor products. Accordingly, increasing the operational speed and integration density of non-volatile memory devices used in semiconductor products may be beneficial. For example, a semiconductor device having a fin-FET structure may have a larger channel surface and, thus, may have increased operational speed. At the same time, the integration density may be increased by reducing the width of the fins of the fin-FET structure.

A fin-FET using a silicon-on-insulator (SOI) substrate may improve a short channel effect. However, SOI substrates may be relatively expensive. Additionally, even when using a SOI substrate, a short channel effect (e.g., drain-induced barrier lowering (DIBL)) may still occur depending on the dielectric properties of the insulator. Thus, attempts have been made to manufacture a fin-FET or a fin memory cell having similar characteristics to a SOI substrate using a bulk semiconductor substrate. Furthermore, as the integration density of a semiconductor device increases, the distance between the fins may be reduced, thus resulting in disturbances during reading operations.

SUMMARY

Example embodiments provide a non-volatile memory device having reduced disturbances during reading operations and a reduced short channel effect. Example embodiments also provide a method of manufacturing a non-volatile memory device having reduced disturbances during reading operations and a reduced short channel effect.

A semiconductor device according to example embodiments may include a semiconductor substrate having a body and a pair of fins protruding from the body; an inner spacer insulating layer on an upper portion of an inner sidewall of the pair of fins; a gate electrode on the semiconductor substrate defining a void between the pair of fins; and/or a gate insulating layer between the gate electrode and the pair of fins. The semiconductor device may also include an upper spacer insulating layer between a top surface of the pair of fins and the gate electrode. The semiconductor device may further include a storage node layer on the gate insulating layer and a blocking insulating layer between the storage node layer and the gate electrode. The void may be further defined by the blocking insulating layer.

A method of manufacturing a semiconductor device according to example embodiments may include etching a semiconductor substrate to form a body and a pair of fins protruding from the body; forming an inner spacer insulating layer on an upper portion of an inner sidewall of the pair of fins; forming a gate insulating layer on an outer sidewall of the pair of fins; and/or forming a gate electrode on the semiconductor substrate so as to define a void between the pair of fins. Forming the inner spacer insulating layer may include forming a buried insulating layer in a space between the pair of fins; forming an insulating layer on the buried insulating layer and the pair of fins; and/or forming an inner spacer insulating layer on the pair of fins by anisotropically etching the insulating layer. The buried insulating layer may be removed by etching, before forming the gate insulating layer.

BRIEF DESCRIPTION OF THE DRAWINGS

The features and advantages of example embodiments will become more apparent up review of the attached drawings in which.

DETAILED DESCRIPTION OF EXAMPLE EMBODIMENTS

Example embodiments will now be described more fully with reference to the accompanying drawings. Example embodiments may, however, be embodied in many different forms and should not be construed as being limited to the examples set forth herein. The sizes of elements in the drawings may have been exaggerated for purposes of illustration.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 1:
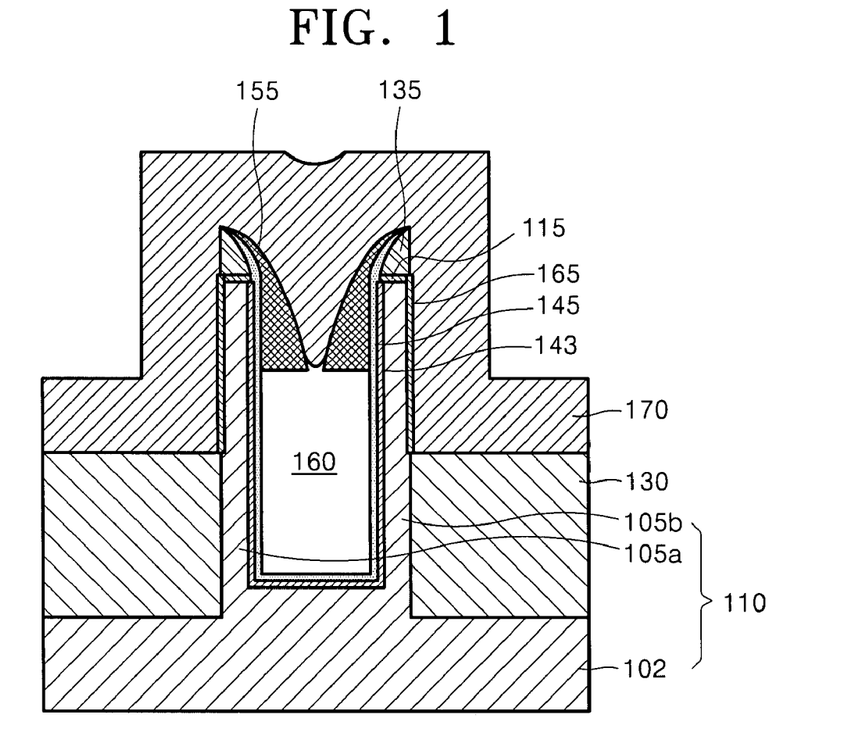
FIG. 1 is a cross-sectional view of a semiconductor device according to example embodiments.

FIG. 1 is a cross-sectional view of a semiconductor device according to example embodiments. Referring to FIG. 1, the semiconductor device may include a semiconductor substrate 110, a gate insulating layer 165, and a gate electrode 170. The flow of current through the semiconductor substrate 110 may be controlled by controlling the gate electrode 170. Accordingly, the semiconductor device may be used as a switching device and may be referred to as a transistor. Hereinafter, the structure of the semiconductor device illustrated in FIG. 1 will be described in more detail.

The semiconductor substrate 110 may include a body 102 and a pair of fins 105a and 105b. For example, the fins 105a and 105b may protrude upward from the body 102 and may be separated from each other. The semiconductor substrate 110 may be formed by etching a bulk semiconductor wafer, e.g., a bulk silicon wafer, bulk silicon-germanium wafer, or other suitable bulk wafer. Thus, the fins 105a and 105b may be formed of the same material as the body 102. Alternatively, the fins 105a and 105b may be formed as a semiconductor epitaxial layer on the body 102.

Inner spacer insulating layers 155 may be formed on the upper portions of the fins 105a and 105b. For example, the inner spacer insulating layers 155 may extend toward each other so as to reduce the entrance width to the region between the fins 105a and 105b. However, the inner spacer insulating layers 155 may be separated from each other so as to not to block the entrance to the region between the fins 105a and 105b. The region between the fins 105a and 105b and below the inner spacer insulating layers 155 may be empty. Thus, a void 160 may be defined between the fins 105a and 105b by covering the space between the inner spacer insulating layers 155, e.g., the entrance to the region between the fins 105a and 105b. The distance between the inner spacer insulating layers 155 may be sufficiently small so that the entrance to the region between the fins 105a and 105b may be easier to cover, which will be described later. The entrance between the inner spacer insulating layers 155 may also allow etching chemicals to permeate into the region during subsequent manufacturing processes.

A gate electrode 170 may cover a portion of the external sidewall of the fins 105a and 105b and may extend across the inner spacer insulating layers 155. Accordingly, the void 160 may be defined between the fins 105a and 105b below the gate electrode 170. The external sidewall of the fins 105a and 105b may refer to the side of the fins 105a and 105b opposite to that on which the inner spacer insulating layers 155 are formed, and the inner sidewall of the fins 105a and 105b may refer to the side on which the inner spacer insulating layers 155 are formed. The gate electrode 170 may be formed directly on the inner spacer insulating layers 155 so as to directly block the space between the inner spacer insulating layers 155. Thus, the void 160 may be formed between the fins 105a and 105b below the gate electrode 170 and the inner spacer insulating layers 155.

Accordingly, the void 160 may be completely bounded by the fins 105a and 105b, the body 102 of the substrate 110, and the gate electrode 170. Additionally, the void 160 may be adequately contained so as to be airtight and waterproof. The void 160 may also contain a gas (e.g., air, inert gas) at, below, or above atmospheric pressure. On the other hand, the void 160 may be a vacuum. Alternatively, one or more sides of the void 160 may not be bounded so as to be open or may be partially bounded so as to have an opening.

Gate insulating layers 165 may be interposed between the gate electrode 170 and external sidewall the fins 105a and 105b. Alternatively, the gate insulating layers 165 may be formed to extend across the inner spacer insulating layers 155 from the external sidewall of the fins 105a and 105b. Consequently, the space between the inner spacer insulating layers 155 may be blocked by the gate insulating layers 165, and the gate electrode 170 may be formed over the gate insulating layers 165. An additional insulating layer (not shown) may be further interposed between the inner spacer insulating layers 155 and the gate electrode 170. Accordingly, the void 160 may be defined by the insulating layer, the gate insulating layers 165, and/or the gate electrode 170.

The gate electrode 170 may be insulated from the body 102. For example, a device separation layer 130 may be formed to cover the lower, external portion of the fins 105a and 105b and may be interposed between the gate electrode 170 and the body 102. The gate insulating layers 165 may be formed to cover an upper, external portion of the fins 105a and 105b above the device separation layer 130. The device separation layer 130 may be formed to have a predetermined height, and the height of the upper and lower portions of the fins 105a and 105b may be controlled according to the height of the device separation layer 130.

Upper spacer insulating layers 135 may be interposed between a top surface of the fins 105a and 105b and the gate electrode 170. The upper spacer insulating layers 135 may be provided to control the width of the fins 105a and 105b during fabrication. A pad insulating layer 115 may be further interposed between the upper spacer insulating layers 135 and the top surface of the fins 105a and 105b. The pad insulating layer 115 may reduce the stress between the upper spacer insulating layers 135 and the fins 105a and 105b. However, at least one of the upper spacer insulating layers 135 and the pad insulating layer 115 may be omitted or replaced with other suitable structures.

A protection layer 145 may be formed on the inner surface the fins 105a and 105b containing the void 160. The protection layer 145 may also extend between the fins 105a and 105b and the inner spacer insulating layers 155. A buffer insulating layer 143 may be provided between the protection layer 145 and the fins 105a and 105b. However, at least one of the protection layer 145 and the buffer insulating layer 143 may be omitted or replaced with another suitable structure.

The fins 105a and 105b may be used as channel regions and may be commonly controlled by the gate electrode 170. Accordingly, FIG. 1 may depict two transistors sharing the gate electrode 170. Consequently, signal interference between the fins 105a and 105b may be significantly reduced by the void 160, because the void 160 may have a lower dielectric constant than other insulating materials, e.g., oxides, nitrides. Also, a depletion region (not shown) formed in the fins 105a and 105b may be restricted. The smaller the width of the fins 105a and 105b, the more the depletion region may be restricted. The depletion region may be more restricted in the width direction of the fins 105a and 105b because of the presence of the void 160 and, thus, may be formed in the height direction of the fins 105a and 105b. However, as the width of the fins 105a and 105b is reduced, the influence of the depletion region formed in the height direction may decrease.

The semiconductor device according to example embodiments may have a silicon-on-void (SOV) structure as opposed to a silicon-on-insulator (SOI) structure. The SOV structure may have a horizontal structure, and the fins 105a and 105b may not be electrically-floated from the body 102. The SOV structure may reduce a short channel effect caused by the expansion of the depletion region. For example, off-current and junction leakage current may be reduced, and a drain-induced barrier lowering (DIBL) effect may be reduced. However, a body-bias may still be applied to the fins 105a and 105b by supplying a voltage to the body 102.

Figure 2:
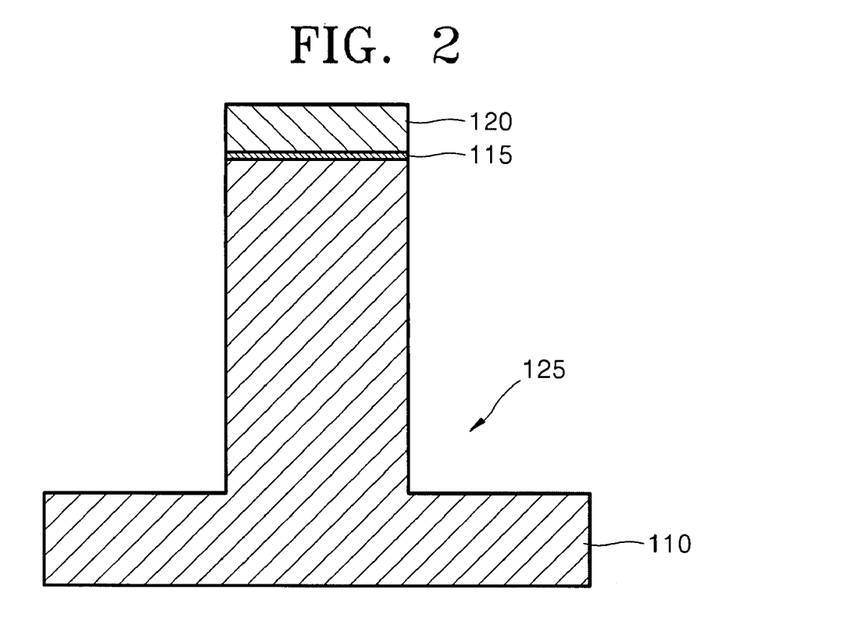
FIGS. 2 through 10 are cross-sectional views illustrating a method of manufacturing a semiconductor device according to example embodiments.

FIGS. 2 through 10 are cross-sectional views illustrating a method of manufacturing a semiconductor device according to example embodiments. Referring to FIG. 2, at least one pair of first trenches 125 may be formed in a semiconductor substrate 110. For example, a hard mask layer 120 may be formed on a portion of the semiconductor substrate 110. The exposed portion of the semiconductor substrate 110 may be etched by using the hard mask layer 120 as an etching mask to form the first trenches 125. A pad insulating layer 115 may also be formed on the semiconductor substrate 110 before forming the hard mask layer 120. The hard mask layer 120 may include a nitride layer so as to have an etching selectivity with respect to the semiconductor substrate 110, and the pad insulating layer 115 may include an oxide layer.

Figure 3:
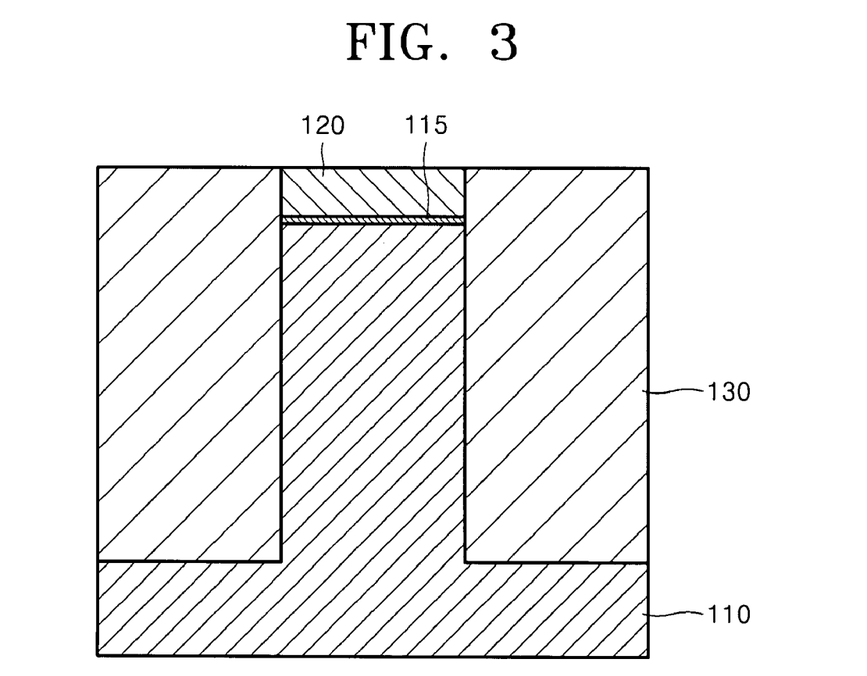

Referring to FIG. 3, a device separation layer 130 may be formed in the first trenches 125. The device separation layer 130 may be formed to sufficiently fill the first trenches 125, and the device separation layer 130 may be planarized until the hard mask layer 120 is exposed. Accordingly, the device separation layer 130 may fill the first trenches 125 and may protrude upwardly from the semiconductor substrate 110. The device separation layer 130 may include an oxide layer.

Figure 4:
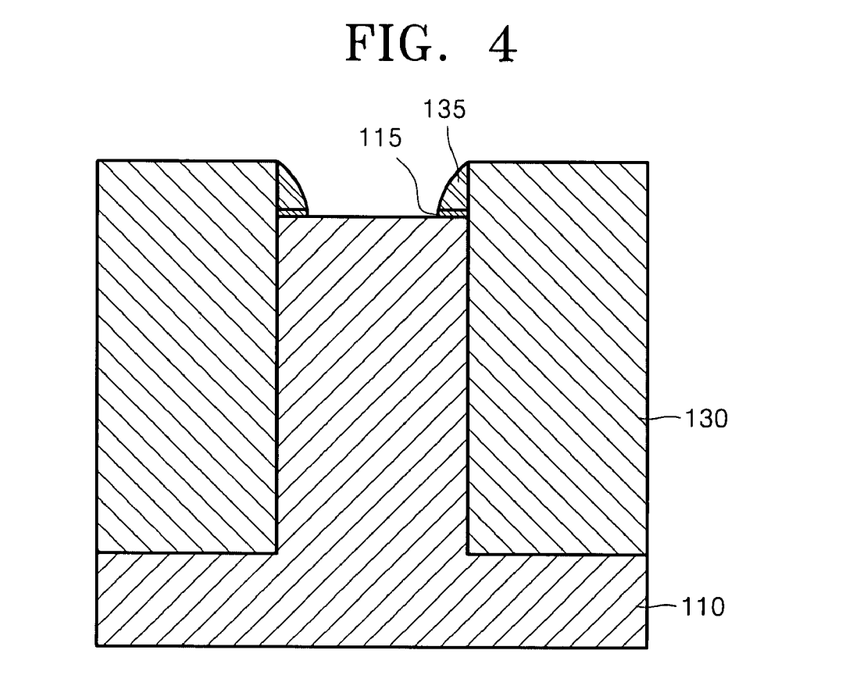

Referring to FIG. 4, the hard mask layer 120 may be removed, and upper spacer insulating layers 135 may be formed on sidewalls the device separation layer 130 and the upper surface of the semiconductor substrate 110 between the first trenches 125. The width of the upper spacer insulating layers 135 may be controlled so as to expose a portion of the semiconductor substrate 110. The upper spacer insulating layers 135 may be formed by providing an insulating layer on the upper surface of the semiconductor substrate 110 between the first trenches 125 and anisotropically etching the insulating layer. Accordingly, the pad insulating layer 115 may remain between the upper spacer insulating layers 135 and the semiconductor substrate 110. Alternatively, when the hard mask layer 120 is removed, the pad insulating layer 115 may also be removed. The upper spacer insulating layers 135 may include a nitride layer so as to have an etching selectivity with respect to the semiconductor substrate 110.

Figure 5:
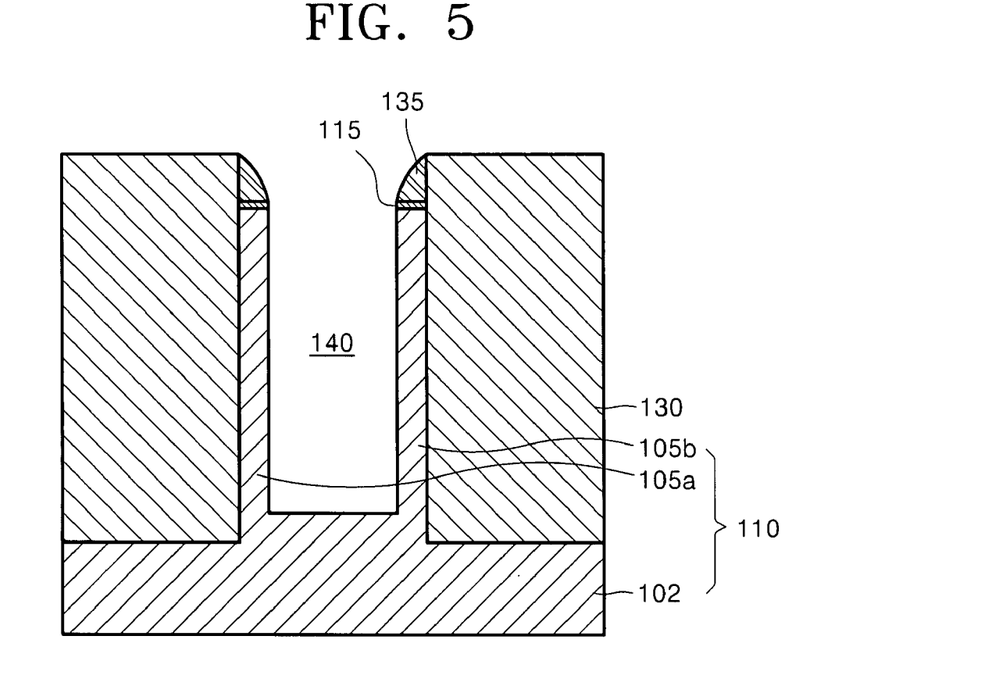

Referring to FIG. 5, a second trench 140 may be formed by etching the exposed portion of the semiconductor device 110 using the upper spacer insulating layers 135 as an etching mask. Accordingly, a pair of fins 105a and 105b protruding from the body 102 of the semiconductor substrate 110 may be formed. The first and second trenches 125 and 140 may have the same depth or may have different depths. The upper spacer insulating layers 135 may define the width of the fins 105a and 105b. Thus, by using the upper spacer insulating layers 135, the width of the fins 105a and 105b may be reduced to a greater extent than when using photolithography. However, the method of forming the fins 105a and 105b is not limited thereto. Alternatively, the fins 105a and 105b may be formed on the body 102 by providing the first and second trenches 125 and 140 using photolithography and etching without utilizing the upper spacer insulating layers 135.

Figure 6:
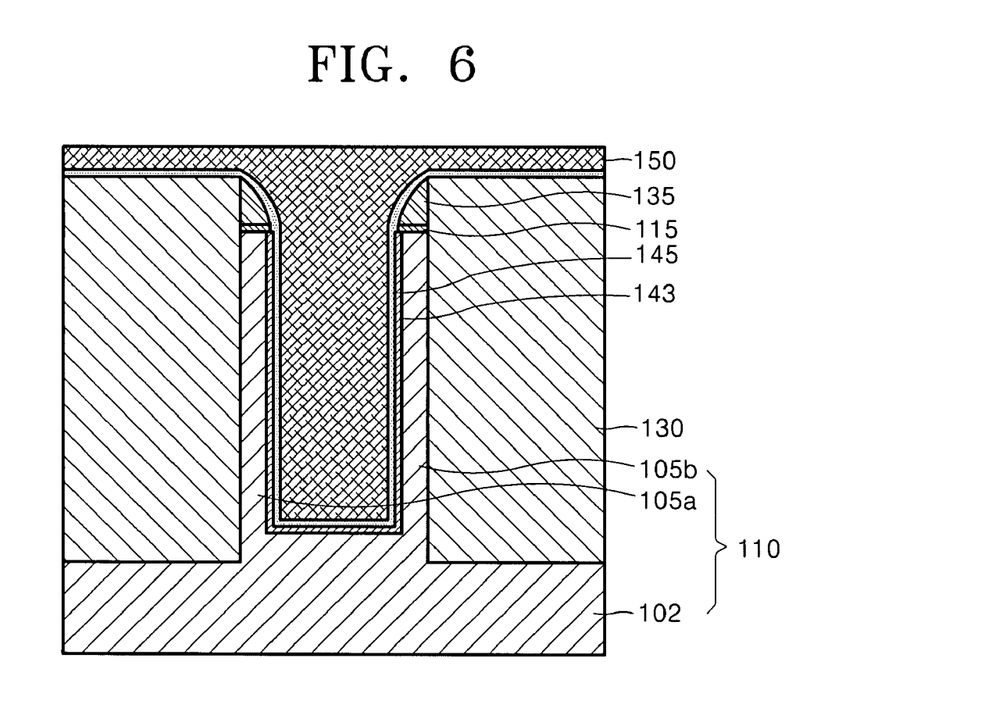

Referring to FIG. 6, a buried insulating layer 150 may be formed to fill the second trench 140 between the fins 105a and 105b. The buried insulating layer 150 may include an oxide layer, and the density of the buried insulating layer 150 may be selected such that the etching rate of the buried insulating layer 150 may be higher than that of the device separation layer 130. A buffer insulating layer 143 and a protection layer 145 may be formed on the inner surface of the second trench 140 before forming the buried insulating layer 150. The buffer insulating layer 143 may be formed by oxidizing a surface of the fins 105a and 105b, and the protection layer 145 may be formed using a chemical vapor deposition (CVD) method. The protection layer 145 may include a nitride layer so as to have an etching selectivity with respect to the device separation layer 130 and the buried insulating layer 150, and the buffer insulating layer 143 may include an oxide layer.

Figure 7:
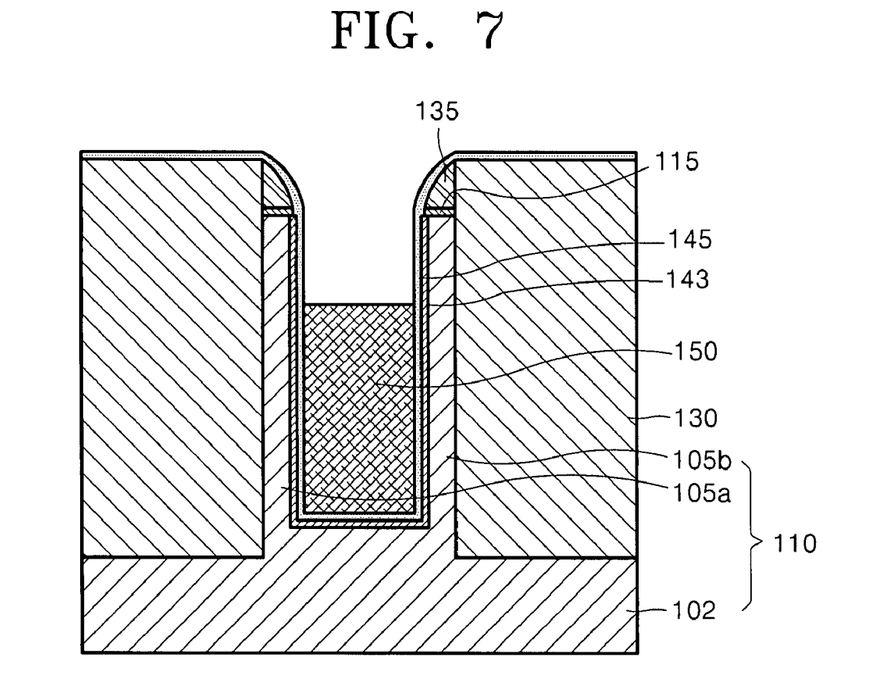

Referring to FIG. 7, an upper portion of the fins 105a and 105b may be exposed by etching the buried insulating layer 150 to a predetermined depth. The protection layer 145 may reduce or prevent the etching of the pad insulating layer 115 and the device separation layer 130. Alternatively, the protection layer 145 and the pad insulating layer 115 may be omitted. Thus, the device separation layer 130 may also be etched when the buried insulating layer 150 is etched. However, the etching rate of the device separation layer 130 may be lower than that of the buried insulating layer 150 by virtue of the device separation layer 130 being formed of a higher density material.

Figure 8:
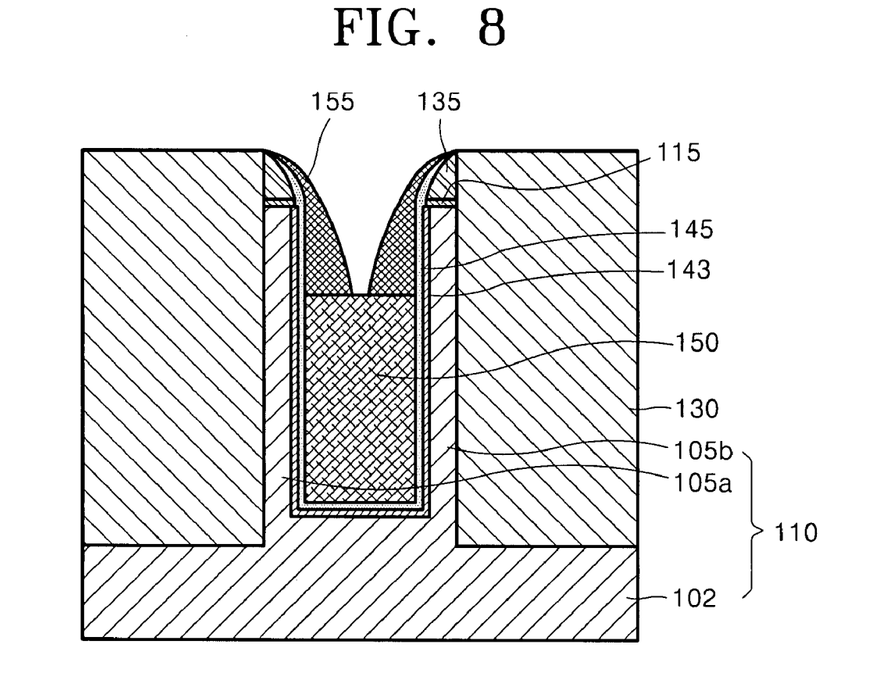

Referring to FIG. 8, inner spacer insulating layers 155 extending toward the center of the second trench 140 (but separated from each other) may be formed on an upper portion of the fins 105a and 105b. For example, an insulating layer (e.g., nitride layer) may be formed on the buried insulating layer 150 and the fins 105a and 105b, and the insulating layer may be anisotropically etched to form the inner spacer insulating layers 155. The inner spacer insulating layers 155 may reduce the entrance width between the fins 105a and 105b. The space between the inner spacer insulating layers 155 (e.g., the entrance to the region between the fins 105a and 105b) may be controlled by varying the thickness of the inner spacer insulating layers 155. The thickness of each of the inner spacer insulating layers 155 may be less than half the distance between the fins 105a and 105b so that the inner spacer insulating layers 155 are not connected so as to block the entrance to the region between the fins 105a and 105b. Alternatively, an inner spacer insulating layer 155 may be formed on one inner sidewall (e.g., inner sidewall of fin 105a) and may extend towards the opposing inner sidewall (e.g., inner sidewall of fin 105b) so that a space is formed between the inner spacer insulating layer 155 and the opposing inner sidewall (e.g., inner sidewall of fin 105b). Thus, the entrance to the region between the fins 105a and 105b may be formed by one inner spacer insulating layer 155 (rather than two).

Figure 9:
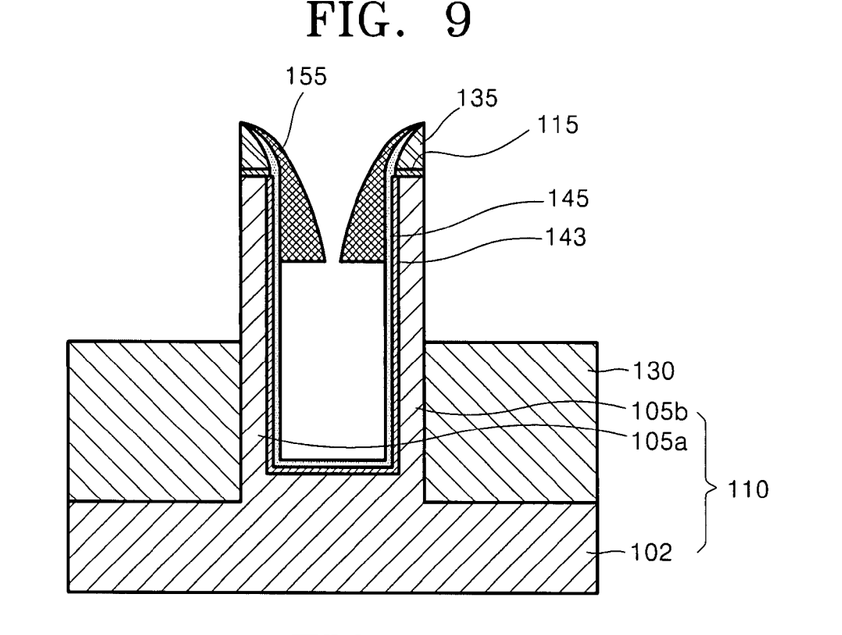

Referring to FIG. 9, the buried insulating layer 150 may be removed by etching the buried insulating layer 150 through the space between the inner spacer insulating layers 155. Accordingly, an empty region (e.g., void 160) between the fins 105a and 105b below the inner spacer insulting layers 155 may be formed. The buried insulating layer 150 may be etched using a wet etching method. Consequently, the space between the inner spacer insulating layers 155 should be of sufficient size to allow the permeation of etching chemicals. The protection layer 145 may not be etched and, thus, may remain on the inner surface of the fins 105a and 105b. While the buried insulating layer 150 is being etched, the device separation layer 130 may also be etched to a predetermined depth so as to expose the upper portion of the fins 105a and 105b. Alternatively, the device separation layer 130 may be etched before or after the buried insulating layer 150 is etched.

Figure 10:
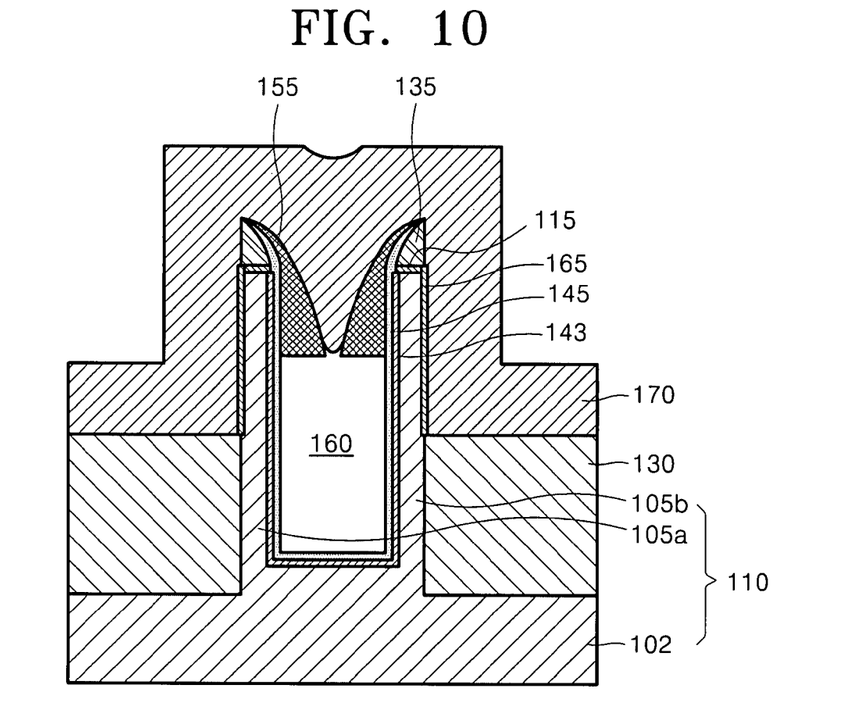

Referring to FIG. 10, gate insulating layers 165 may be formed on an upper portion of the external sidewalls of the fins 105a and 105b. The gate insulating layers 165 may be formed by oxidizing the fins 105a and 105b. A gate electrode 170 may be formed on the gate insulating layers 165. For example, the gate electrode 170 may include polysilicon, metal, and/or metal silicide. Thus, the void 160 may be defined between the fins 105a and 105b below the gate electrode 170 and the inner spacer insulating layers 155. Alternatively, the gate insulating layers 165 may be formed using a CVD method. Consequently, the gate insulating layers 165 on the fins 105a and 105b may be connected so as to extend across the inner spacer insulating layers 155.

Figure 11:
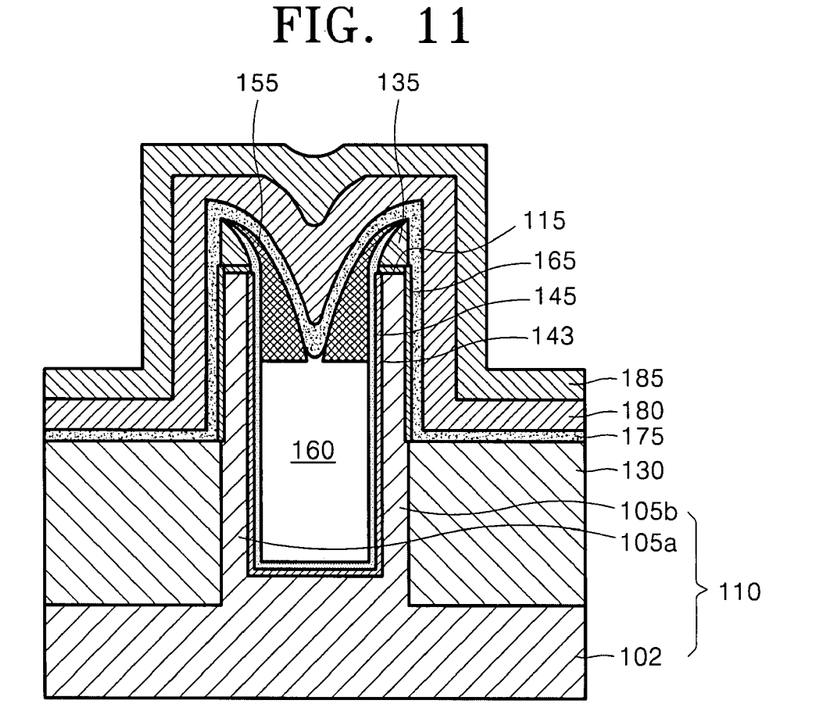
FIG. 11 is a cross-sectional view of another semiconductor device according to example embodiments.

FIG. 11 is a cross-sectional view of another semiconductor device according to example embodiments. Referring to FIG. 11, the semiconductor device may include a semiconductor substrate 110, gate insulating layers 165, a storage node layer 175, a blocking insulating layer 180, and a gate electrode 185. Charges may be stored in the storage node layers 175, and the stored charges may be removed by controlling the gate electrode 185. Accordingly, the semiconductor device may be used as a non-volatile memory device that is capable of storing data. For example, the semiconductor device according to example embodiments may be used as a flash memory device.

The semiconductor device of FIG. 11 may share similarities with the semiconductor device of FIG. 1. Thus, discussions regarding common elements will not be repeated. For example, the semiconductor substrate 110, the device separation layer 130, the upper spacer insulating layers 135, the inner spacer insulating layers 155, and the protection layer 145 may be as described above with regard to FIG. 1. Also, the gate insulating layer 165 may be referred to as a tunneling insulating layer for functioning as a charge path, and the description of the gate insulating layer 165 may be the same as that of FIG. 1 and, thus, will not be repeated. Additionally, the gate electrode 185 may be referred to as a control gate electrode, because the gate electrode 185 may store or erase data to and from the storage node layer 175. The description of the gate electrode 185 may be the same as that of the gate electrode 170 of FIG. 1 and, thus, will not be repeated.

The storage node layers 175 may be formed to cover the gate insulating layers 165. For example, the storage node layers 175 may be extended to cover the gate insulating layers 165 and the inner spacer insulting layers 155. Thus, the storage node layers 175 covering the gate insulating layers 165 and the inner spacer insulting layers 155 may be connected as one layer. Consequently, the space between the inner spacer insulating layers 155 may be covered by the storage node layers 175. Accordingly, the void 160 may be further defined not only by the gate electrode 185, but also by the storage node layers 175.

The storage node layers 175 may include polysilicon, silicon or metal dots, nano-crystals of silicon or metal, and/or silicon nitride. For example, the storage node layers 175 including polysilicon may be used as floating gates. The storage node layers 175 including the silicon or metal dots, nano-crystals of silicone or metal, and/or silicon nitride may be used as charge trapping layers. The blocking insulating layer 180 may be interposed between the storage node layers 175 and the gate electrode 185 and may extend across the inner spacer insulating layers 155. The blocking insulating layer 180 may reduce or prevent the tunneling of charges between the storage node layers 175 and the gate electrode 185.

The gate electrode 185 may be used as a portion of a word line, and the fins 105a and 105b may be used as a portion of a bit line. Thus, 2-bit data may be processed in a single level operation mode, and the storage node layers 175 may be used as local charge trapping layers. While processing 2-bit data, charges stored in the storage node layers 175 covering the fins 105a and 105b may affect the potential of the fins 105a and 105b. However, because the fins 105a and 105b may be separated from each other by the void 160, the dielectric coupling of the fins 105a and 105b may be reduced, because the void 160 may have a lower dielectric constant than other insulating materials. Accordingly, variations of threshold voltage because of the dielectric coupling between the fins 105a and 105b may be reduced or prevented and, thus, reading disturbances may be reduced or suppressed. Furthermore, the semiconductor device according to example embodiments may have a SOV structure as described above with reference to FIG. 1, and the advantages thereof may be as described with reference to FIG. 1.

Figure 12:
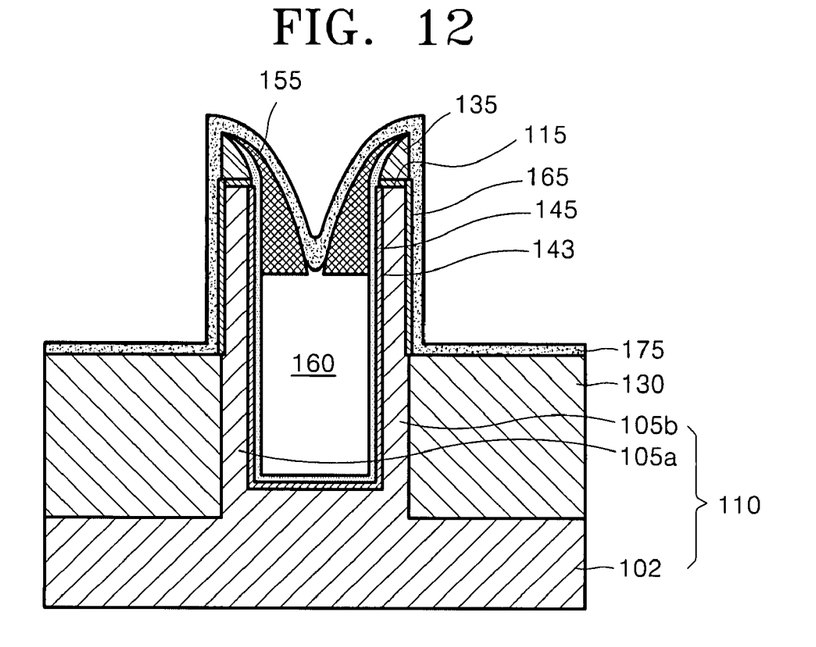
FIGS. 12 and 13 are cross-sectional views illustrating another method of manufacturing a semiconductor device according to example embodiments.
Figure 13:
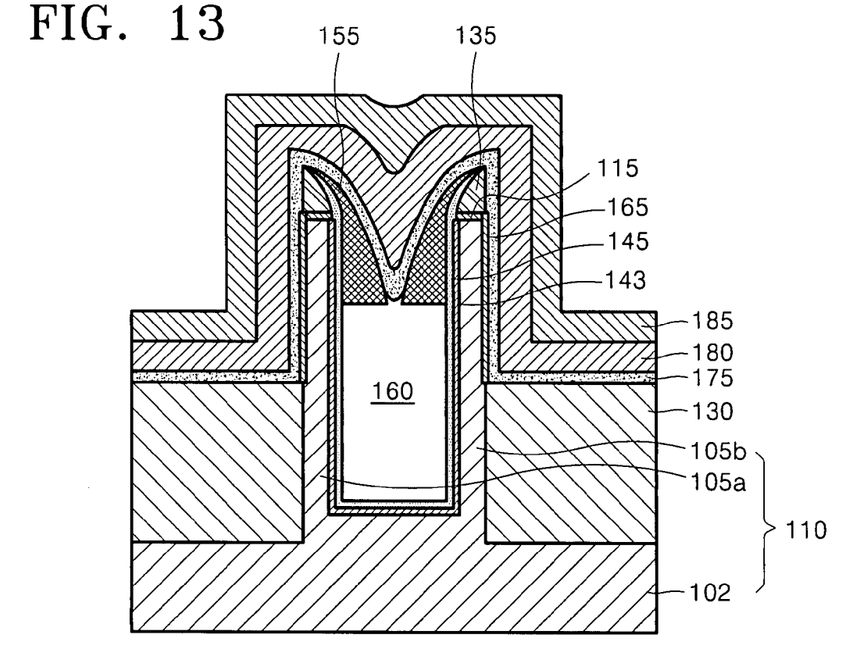

FIGS. 12 and 13 are cross-sectional views illustrating another method of manufacturing a semiconductor device according to example embodiments. However, portions of the method may be the same as described with reference to FIGS. 2 through 10. Accordingly, common portions of the method will not be repeated. Referring to FIGS. 2 through 10, operations for manufacturing the semiconductor device may be performed up to the forming of the gate insulating layers 165.

Referring to FIG. 12, storage node layers 175 covering the gate insulating layers 165 may be formed. The storage node layers 175 may be formed to cover the fins 105a and 105b and may extend across the inner spacer insulating layers 155. Accordingly, the space between the inner spacer insulating layers 155 may be covered by the storage node layers 175, and a void 160 may be defined between the fins 105a and 105b.

Referring to FIG. 13, a blocking insulating layer 180 may be formed to cover the storage node layers 175 and to extend across the inner spacer insulating layers 155. The blocking insulating layer 180 may be formed of an oxide layer, a nitride layer, or a higher-k dielectric layer using a CVD method. A gate electrode 185 may be formed to cover the blocking insulating layer 180. The gate electrode 185 may extend across the inner spacer insulating layers 155 and may cover the upper, external sidewalls of the fins 105a and 105b. Accordingly, the void 160 may be defined below the gate electrode 185 and may further be defined by blocking insulating layer 180 and the storage node layer 175. The gate electrode 185 may include at least one of polysilicon, metal, and metal silicide.

Figure 14:
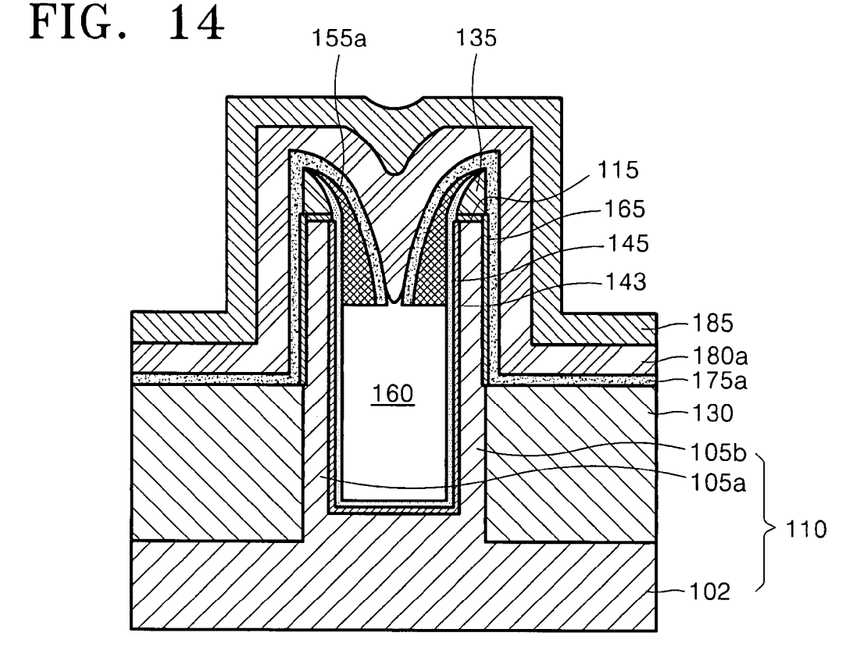
FIG. 14 is a cross-sectional view of yet another semiconductor device according to example embodiments.

FIG. 14 is a cross-sectional view illustrating another semiconductor device according to example embodiments. The semiconductor device of FIG. 14 is a modified example of the semiconductor device of FIG. 11. Thus, descriptions of common elements that have been previously provided will not be repeated below. Referring to FIG. 14, storage node layers 175a may not be connected to one another so as to form one continuous layer (unlike the storage node layer 175 of FIG. 11). The storage node layers 175a covering the upper, external sidewalls of the fins 105a and 105b may cover the upper portion of inner spacer insulating layers 155a but may terminate near the entrance to the void 160 so as to be separated in the space between the inner spacer insulating layers 155a. Accordingly, the distance between the inner spacer insulating layers 155a of FIG. 14 may be greater than the distance between the inner spacer insulating layers 155 of FIG. 11. Alternatively, the storage node layers 175a may be formed as spacers covering the external sidewalls of the fins 105a and 105b. For example, the storage node layers 175a may be disposed substantially parallel to the external sidewalls of the fins 105a and 105b to cover the gate insulating layers 165.

A blocking insulating layer 180a may be formed to cover the storage node layers 175a and may extend across the inner spacer insulating layers 155a. Consequently, the space between the inner spacer insulating layers 155a may be filled by the blocking insulating layer 180a. Accordingly, the void 160 may be defined between the fins 105a and 105b below the blocking insulating layer 180a and the inner spacer insulating layers 155a. Each of the storage node layers 175a may be used as independent charge storage layers. Accordingly, the movement of charges via the storage node layers 175a may be reduced or prevented, and errors in data reading operations may be reduced or prevented.

As discussed above, methods of manufacturing a semiconductor device according to example embodiments may be understood with reference to the methods illustrated in FIGS. 2-10 and FIGS. 12-13. The semiconductor device according to example embodiments may have a SOV structure and a reduced short channel effect. For example, the off-current and junction leakage current may be reduced, the on-current may be increased, and the DIBL value may be reduced. However, a body-bias voltage may still be applied to the fins by supplying a voltage to the body of the semiconductor device. The semiconductor device may also have a higher reading reliability, because disturbances during reading operations may be reduced compared to a semiconductor device having a conventional SOI structure.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A semiconductor device comprising:
    a semiconductor substrate having a body and a pair of fins protruding from the body;
    an inner spacer insulating layer on an upper portion of an inner sidewall of the pair of fins;
    a gate electrode on the semiconductor substrate defining a void between the pair of fins; and
    a gate insulating layer between the gate electrode and the pair of fins,
    wherein the gate insulating layer and the gate electrode cover external sides of the pair of fins opposite to the inner sidewall of the pair of fins, and the gate electrode extends across the pair of fins.

2. The semiconductor device of claim 1, wherein
    the gate electrode is on the inner spacer insulating layer, and
    the void is below the inner spacer insulating layer.

3. The semiconductor device of claim 1, further comprising:
    an upper spacer insulating layer between a top surface of the pair of fins and the gate electrode.

4. The semiconductor device of claim 1, further comprising:
    a protection layer on an inner surface of the pair of fins.

5. The semiconductor device of claim 1, further comprising:
    a device separation layer on a lower portion of an outer sidewall of the pair of fins and between the gate electrode and the body.

6. The semiconductor device of claim 1, further comprising:
    a storage node layer on the gate insulating layer; and
    a blocking insulating layer between the storage node layer and the gate electrode.

7. The semiconductor device of claim 1, wherein the semiconductor substrate is formed by etching a bulk semiconductor wafer.

8. The semiconductor device of claim 6, wherein
    the storage node layer is on the inner spacer insulating layer, and
    the void is further defined by the storage node layer.

9. The semiconductor device of claim 6, further comprising:
    an upper spacer insulating layer between a top surface of the pair of fins and the inner spacer insulating layer.

10. The semiconductor device of claim 6, further comprising:
    a protection layer on an inner surface of the pair of fins.

11. The semiconductor device of claim 6, wherein a portion of the storage node layer terminates on the inner spacer insulating layer near the void.

12. The semiconductor device of claim 11, wherein
    the blocking insulating layer is on the terminal portion of the storage node layer, and
    the void is further defined by the blocking insulating layer.

* * * * *